United States Patent
Subramanian et al.

(10) Patent No.: US 6,274,289 B1
(45) Date of Patent: Aug. 14, 2001

(54) CHEMICAL RESIST THICKNESS REDUCTION PROCESS

(75) Inventors: Ramkumar Subramanian, San Jose; Michael K. Templeton, Atherton; Bharath Rangarajan, Santa Clara; Ursula Q. Quinto, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/708,104

(22) Filed: Nov. 6, 2000

Related U.S. Application Data

(60) Provisional application No. 60/242,803, filed on Oct. 24, 2000, and provisional application No. 60/212,481, filed on Jun. 16, 2000.

(51) Int. Cl.[7] .................................................. G03F 7/11
(52) U.S. Cl. ................................... 430/273.1; 430/270.1; 430/327
(58) Field of Search ..................................... 430/327, 324, 430/326, 273.1, 270.1

(56) References Cited

U.S. PATENT DOCUMENTS

| Re. 35,821 | * | 6/1998 | Niki et al. ............................ 430/326 |
| 5,342,727 | | 8/1994 | Vicari et al. ........................ 430/157 |
| 5,529,888 | * | 6/1996 | Watanabe et al. ................... 430/331 |
| 5,538,833 | | 7/1996 | Ferguson et al. .................... 430/325 |
| 5,750,312 | * | 5/1998 | Chandross et al. ............... 430/273.1 |
| 5,807,649 | | 9/1998 | Liebmann et al. ....................... 430/5 |
| 5,858,620 | | 1/1999 | Ishibashi et al. .................... 430/313 |
| 5,905,019 | * | 5/1999 | Obszarny ............................. 430/327 |

OTHER PUBLICATIONS

"0.1um Level Contact Hole Pattern Formation with KrF Lithography by Resolution Enhancement Lithography Assisted by Chemical Shrink (RELACS)," T. Toyoshima, et al., Advanced Technology R&D Center, Mitsubishi Electric Corp., IEDM IEEE 1998, pp. 98–333–336.

"Monitoring Acid Diffusion in Chemically Amplified Photoresists," S. Postnikov, et al., Department of Chemistry and Biochemistry, University of Texas at Austin, Feb. 8, 1998.

* cited by examiner

*Primary Examiner*—Rosemary E. Ashton
(74) *Attorney, Agent, or Firm*—Amin & Turocy, LLP

(57) ABSTRACT

In one embodiment, the present invention relates to a method of treating a resist layer involving the steps of providing the resist layer having a first thickness, the resist layer comprising a polymer having a labile group; contacting a coating containing at least one cleaving compound with the resist layer to form a deprotected resist layer at an interface between the resist layer and the coating; and removing the coating and the deprotected resist layer leaving a resist having a second thickness, wherein the second thickness is smaller than the first thickness.

20 Claims, 2 Drawing Sheets

CHEMICAL RESIST THICKNESS REDUCTION PROCESS

RELATED APPLICATIONS

This application claims domestic priority to provisional application Ser. No. 60/212,481 filed Jun. 16, 2000 and to provisional application Ser. No. 60/242,803 filed Oct. 24, 2000.

TECHNICAL FIELD

The present invention generally relates to improving lithography by using a coating containing a cleaving compound to reduce the thickness of a resist layer. In particular, the present invention relates to using a coating containing a cleaving compound to controllably decrease the thickness of a resist layer.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This includes the width and spacing of interconnecting lines and the surface geometry such as corners and edges of various features. Since numerous interconnecting lines are typically present on a semiconductor wafer, the trend toward higher device densities is a notable concern.

The requirement of small features (and close spacing between adjacent features) requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, lithography is not without limitations. Patterning features having dimensions of about 0.25 µm or less with acceptable resolution is difficult at best, and impossible in some circumstances. Patterning small features with a high degree of critical dimension control is also very difficult. Procedures that increase resolution, improved critical dimension control, and provide small features are therefore desired.

In an effort to increase resolution, improved critical dimension control, and provide small features, relatively thin photoresists are employed. However, there are problems associated with employing thin photoresist. For example, one problem is that the pinhole density is typically quite high when forming a thin photoresist layer. Pinholes lead to defects in pattern formation. Another problem is that it is difficult to planarize a thin photoresist. This is important because a non-planar photoresist layer tends not lead to a uniform patterned resist.

SUMMARY OF THE INVENTION

The present invention provides chemical resist thickness reduction processes, methods of forming thin resists, and methods of treating resists. The present invention also provides thin resist features that are particularly useful for subsequent semiconductor processing procedures. The methods of forming thin resists are conducted in a controllable manner whereby a specified or desired thickness of the resist may be achieved. As a result of the present invention, a relatively thin resist layer having a reduced pinhole density is provided. The thin resists of the present invention facilitate the use of small wavelengths that typically have difficulty in deeply penetrating resist layers.

In one embodiment, the present invention relates to a method of treating a resist layer involving the steps of providing the resist layer having a first thickness, the resist layer comprising a polymer having a labile group; contacting a coating containing at least one cleaving compound with the resist layer to form a deprotected resist layer at an interface between the resist layer and the coating; and removing the coating and the deprotected resist layer leaving a resist having a second thickness, wherein the second thickness is smaller than the first thickness.

In another embodiment, the present invention relates to a chemical resist thickness reduction process involving the steps of forming a resist layer having a first thickness, the resist layer comprising a polymer having an acid labile pendent group; depositing an acid containing coating over the resist layer, the acid containing coating comprising at least one acid and a coating material, thereby forming a deprotected resist layer at an interface between the resist layer and the acid containing coating; and removing the acid containing coating and the deprotected resist layer thereby providing a resist layer having a second thickness, the first thickness greater than the second thickness.

In yet another embodiment, the present invention relates to a method of decreasing the thickness of a resist, involving the steps of providing a chemically amplified resist having a first thickness on a substrate; depositing an acid containing coating on the chemically amplified resist thereby forming a deprotected resist layer within the chemically amplified resist; and removing the acid containing coating and the deprotected resist layer leaving a chemically amplified resist having a second thickness, wherein the second thickness is at least about 10% smaller than the first thickness.

DISCLOSURE OF INVENTION

Figure 1:
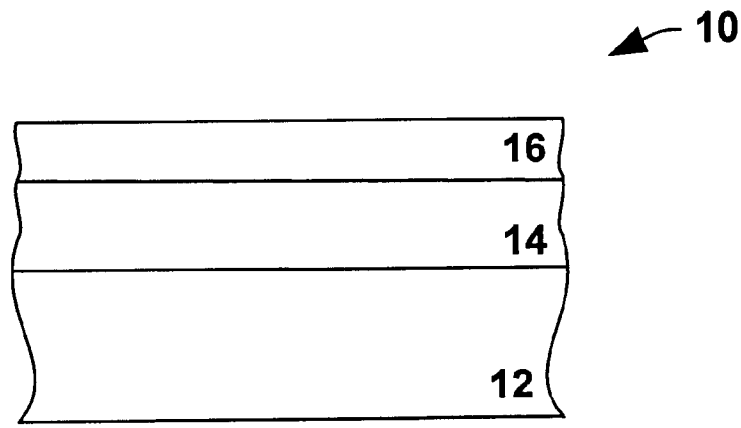
FIG. 1 illustrates a cross-sectional view of one aspect of a method according to the present invention.

The present invention involves using a coating containing a cleaving compound to controllably decrease the thickness of resist layers. The present invention thus involves resist thinning methods and/or methods of decreasing the thickness of a resist layer below that associated with conventional deposition techniques.

A coating containing a cleaving compound is deposited over a patterned resist. While the resist is in contact with the coating containing a cleaving compound, a chemical interaction takes place within the portions of the resist adjacent the coating forming a deprotected resist layer within the resist. Although not wishing to be bound by any theory, it is believed that the cleaving compound from the coating diffuses into the top or upper portion of the resist adjacent the coating. It is believed that cleaving compounds at or near the interface of the coating and the resist cause a chemical change wherein labile groups of the resist polymer are cleaved or deprotected and the cleaved or deprotected portions of the resist become removable by an appropriate solvent or developer. That is, the cleaving compound cleaves labile moieties of the resist material, thereby changing the solubility characteristics of the top or upper portion of the resist material wherein such cleavage takes place. Thus, a deprotected resist layer is formed within the developed resist which is then removable or further developable after or while the coating is removed.

For example, an acid containing coating is deposited over an acid catalyzed resist. While the resist is in contact with the acid containing coating, a chemical interaction takes place within the portions of the resist adjacent the acid containing coating forming a deprotected resist layer within the top portion of the resist. Again, although not wishing to be bound by any theory, it is believed that hydronium ions or protons from the acid containing coating diffuse into the top portion of the resist adjacent the acid containing coating. It is believed that hydronium ions or protons at or near the interface of the acid containing coating and the resist polymer cause a chemical change wherein the deprotected portions of the resist become removable by an appropriate developer. That is, hydronium ions or protons cleave acid labile moieties of the resist material, such as t-butoxycarbonyl moieties from a resist polymer backbone, thereby changing the solubility characteristics of that portion of the resist material. Thus, a deprotected resist layer is formed within the top portion of the resist which is then removable after or while the acid containing coating is removed. A thinned resist is thus provided which may be patterned and used as a mask for further processing.

Initially, a resist is deposited over a substrate in any suitable manner. The substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The resist is provided over a portion of the substrate or over all of the substrate.

Any suitable resist polymer having a labile group may be employed in the present invention. The polymers are generally obtained by one or more of vinylic addition polymerization, condensation, polyaddition, and addition condensation. Suitable resist polymer have a cleavable labile group, such as an acid labile group (cleavable by an acid). Typically, the resist polymer has a pendant labile group attached to the polymer backbone. Alternatively, the resist polymer has a labile group attached to one or more terminuses of the polymer backbone.

Generally, in one embodiment, the polymer is a polymer or copolymer of vinyl phenol and optionally other copolymerizable group(s). Copolymers comprise units of substituted or unsubstituted phenols and non-aromatic groups, particularly copolymers of vinyl phenols and alkyl acrylates, typically alkyl acrylates having from 1 to about 12 carbon atoms. Preferred are copolymers of vinyl phenols and acrylates having branched alkyl chains, such as copolymers formed from t-butyl acrylate, t-butyl methacrylate, etc.

In one embodiment, the polymer is at least one of poly (p-tertbutoxycarbonyloxy-α-methylstyrene), poly(p-tert-butoxycarbonyloxystyrene), poly(tert-butyl p-vinylbenzoate), poly(tert-butyl p-isopropenylphenyloxyacetate), poly(tert-butyl methacrylate), polymethylmethacrylate, acrylate based polymers, a novolak/diazonaphthoquinione resin, a nitrene crossed hydroxystyrene polymer, and poly(butene-1-sulfone). In another embodiment, the polymer comprises phenolic and cyclic alcohol units. In this embodiment, the polymer is formed by the hydrogenation of a phenol formaldehyde (novolak) or a poly(vinylphenol) resin. In yet another embodiment, the polymer comprises hydroxystyrene and acrylate, methacrylate, mixtures of acrylate and methacrylate, adamantyl methacrylate, 3-oxo-cyclohexyl methacrylate, tetrahydropyranymethacrylate, trycyclodecanyl acrylate, isobornyl polymers, polynorbornene, polyanthrylmethacrylate, poly(vinylmethyl ether-co-maliec anhydride), poly(styrene-co-maleic anhydride).

In another embodiment, the polymeric material includes a partially tbutoxycarbonyloxy substituted poly-p-hydroxystyrene, partially t-butoxycarbonyloxy substituted poly-3-hydroxyphenyl phenylsiloxane, partially t-butyl substituted polymethacrylate, and partially adamantyl substituted polymethacrylate.

In one embodiment, the resist contains an acid catalyzed resin material. The acid catalyzed resin material undergoes a chemical change upon exposure to actinic radiation. Acid catalyzed or chemically amplified resist compositions generally comprise a photosensitive acid (photoacid) generator and a polymer. The polymer has acid sensitive side chain (pendent) groups which are bonded to the polymer backbone and are reactive towards a proton. Upon imagewise exposure to radiation or heat, the photoacid generator produces a proton. The proton causes catalytic cleavage of an acid labile pendant group from the polymer backbone. The proton is not consumed in the cleavage reaction and catalyzes additional cleavage reactions thereby chemically amplifying the photochemical response of the resist. The cleaved polymer is soluble in polar developers while the unexposed polymer is soluble in nonpolar organic solvents. Thus the resist can provide positive or negative images of the mask depending of the selection of the developer solvent.

Generally, in many embodiments, the acid labile pendent groups attached to the resist polymer are tert-butyl esters of carboxylic acids and tert-butyl carbonates of phenols, including trityl, benzyl, benzyhdryl modifications thereof. In one embodiment, the acid labile groups include acetate groups such as acetate groups of Formula (I) $CR^1R^2C(=O)OR^3$, where $R^1$ and $R^2$ are each independently one of hydrogen, an electron withdrawing group such as halogen, lower alkyl having from 1 to about 10 carbon atoms, and substituted lower alkyl having from 1 to about 10 carbon atoms; and $R^3$ is substituted and unsubstituted lower alkyl having from 1 to about 10 carbon atoms, substituted and unsubstituted aryl having from 1 to about 10 carbon atoms, substituted or unsubstituted benzyl having from about 7 to about 13 carbon atoms. The substituents can be, for example, one or more halogen, lower alkyl, lower alkoxy, aryl or benyzl. $R^1$ and $R^2$ in one embodiment are each hydrogen. In a preferred embodiment, $R^1$ and $R^2$ are both fluorine. In another embodiment, the acid labile groups include oxycarbonyl groups of the formula C(=O)OR$^3$, where $R^3$ is the same as defined above. In a preferred embodiment, $R^3$ is tert-butyl or benzyl.

In another embodiment, examples of the acid labile group include tertiary alkoxy groups such as tert-butoxy; tert-butyl methacrylate, carbonate groups such as tert-butoxycarbonyloxy; tertiary carboxylate groups such as ter-tbutoxycarbonylmethyloxy; trialkylsilyloxy groups such as trimethylsilyloxy, triethylsilyloxy, and tert-butyl-dimethylsilyloxy; and acetal and ketal groups such as tetrahydrofuranyloxy, tetrahydropyranyloxy, 2-methoxytetra-hydropyranyloxy, methoxymethyloxy, 1-ethoxyethoxy, 1-propoxyethoxy, 1-n-butoxyethoxy, 1-isobutoxyethoxy, 1-sec-butoxyethoxy, 1-tert-butoxyethoxy, 1-amyloxyethoxy, 1-ethoxy-1-methylethoxy, 1-propoxy-1-methylethoxy, 1-n-butoxy-1-methylethoxy, 1-isobutoxy-1-methylethoxy, 1-sec-butoxy-1-methylethoxy, 1-tert-butoxy-1-methylethoxy, and 1-amyloxy-1-methylethoxy groups. Preferred examples of the aromatic group having an acid labile group are tert-butoxyphenyl, tertbutoxycarbonylmethyloxyphenyl, (1-ethoxyethoxy) phenyl, tetrahydropyranyloxyphenyl, and tetrahydrofuranyloxyphenyl groups.

The photoacid generator may be chosen from a wide variety of compounds known to form acid upon exposure to activating radiation. These photoacid generators form an acid in response to radiation of different wavelengths ranging from visible to X-ray. In one general embodiment, photoacid generating compounds include aromatic substituted halohydrocarbons (such as 1,1-bis(p-chlorophenyl)-2, 2,2-trichloroethane), halo-substituted sulfur containing compounds, haloheterocyclic compounds, onium salts (such as diaryl diazonium salts), sulfonated esters, and sulfonated ketones.

In one embodiment, the photoacid generator is one or more unsubstituted and symmetrically or unsymmetrically substituted diaryliodonium, aryldiazonium, triarylselenonium or triarylsulfonium salts. In another embodiment, the photoinitiator is one or more nitrobenzyl esters and s-triazine derivatives.

In one embodiment, the photoacid generator is an o-quinone diazide sulfonic acid ester including 2,1,4-diazonaphthoquinone sulfonic acid esters and the 2,1,5-diazonaphthoquinone sulfonic acid esters. In another embodiment, the photoacid generator is a sulfonated ester including sulfonyloxy ketones. Examples include benzoin tosylate, t-butylphenyl alpha-(p-toluenesulfonyloxy)-acetate, and t-butyl alpha-(p-toluenesulfonyloxy)-acetate.

In yet another embodiment, the photoacid generator is an onium salt. Examples of suitable onium salts are diaryldiazonium salts and onium salts of Group Va and B, Ia and B and I of the Periodic Table, for example, halonium salts, quaternary ammonium, phosphonium and arsonium salts, aromatic sulfonium salts and sulfoxonium salts or seleonium salts.

In still yet another embodiment, the photoacid generator includes triaryl sulfonium hexafluoroantimonate, diaryliodonium metal halides, and certain non-ionic acid generators such as tris(sulfonate) of pyrogallol, and Nsulfonyloxynaphthalimides. In this embodiment, preferred examples include triphenylsulfonium triflate and N-sulfonyloxynaphthalimide generators such as N-camphorsulfonyloxynaphthalimide and N-pentafluorobenzenesulfonyloxnaphthalimide.

In yet another embodiment, the photoacid generator includes halogenated nonionic, photoacid generating compounds such as, for example, 1,1-bis [p-chlorophenyl]-2,2, 2-trichloroethane (DDT); 1,1-bis [p-methoxyphenyl]-2,2,2 -trichloroethane; 1,2,5,6,9,10-hexabromocyclododecane; 1,10-dibromodecane; 1,1-bis[p-chloropehnyl]-2,2-dichloroethane; 4,4'-dichloro-2-(trichloromethyl) benzhydrol (Kelthane); hexachlorodimethyl sulfone; 2-chloro-6-(trichloromethyl) pyridine; 0,0-diethyl-0-(3,5,6-trichloro-2-pyridyl)phosphorothionate; 1,2,3,4,5,6-hexachlorocyclohexane; N(1,1-bis [p-chlorophenyl]-2,2,2-trichloroethyl)acetamide; tris [2,3-dibromopropyl] isocyanurate; 2,2-bis [p-chlorophenyl]-1,1-dichloroethylene; tris [trichloromethyl] s-triazine; and their isomers, analogs, homologs, and residual compounds.

In yet another embodiment, the photoacid generator includes sulfonium salts. Examples of sulfonium salts include tris(4-dimethylaminophenyl)sulfonium p-toluenesulfonate; bis(4-tert-butoxyphenyl)(4-dimethylaminophenyl)sulfonium p-toluenesulfonate; (4-tert-butoxyphenyl)bis(4-dimethylaminophenyl) sulfonium p-toluenesulfonate; bis(4-tert-butoxycarbonylmethyloxyphenyl)(4-dimethylaminophenyl) sulfonium p-toluenesulfonate; (4-tert-butoxycarbonylmethyloxyphenyl)bis(4-dimethylaminophenyl)sulfonium p-toluenesulfonate; bis(4-(1-ethoxyethyloxy)phenyl)(4-dimethylaminophenyl)-sulfonium p-toluenesulfonate; (4-(1-ethoxyethyloxy) phenyl)bis(4-dimethylaminophenyl)-sulfonium p-toluenesulfonate; bis(4-tetrahydropyranyloxyphenyl)(4-dimethylaminophenyl)-sulfonium p-toluenesulfonate; (4-tetrahydrofuranyloxyphenyl)bis(4-dimethylaminophenyl)sulfonium p-toluenesulfonate; tris(4-dimethylaminophenyl)sulfonium p-ethylbenzenesulfonate; bis(4-tert-butoxyphenyl)(4-dimethylaminophenyl) sulfonium p-ethylbenzenesulfonate; (4-tert-butoxyphenyl) bis(4-dimethylaminophenyl)sulfonium p-ethylbenzenesulfonate; tris(4-dimethylaminophenyl) sulfonium 2,4-dimethylbenzenesulfonate; bis(4-tert-butoxyphenyl)(4-dimethylaminophenyl)sulfonium 2,4-dimethylbenzenesulfonate; (4-tert-butoxyphenyl)bis(4-dimethylaminophenyl)sulfonium 2,4-dimethylbenzenesulfonate; (4-tertbutoxyphenyl)bis(4-dimethylaminophenyl)sulfonium p-tert-butylbenzenesulfonate; bis(4-tert-butoxycarbonylmethyloxyphenyl)(4-dimethylaminophenyl)sulfonium 2,5-dimethylbenzenesulfonate; (4-tert-butoxycarbonylmethyloxyphenyl)bis(4-dimethylaminophenyl)sulfonium n-octylbenzenesulfonate; tris(4-dimethylaminophenyl)sulfonium p-tert-butylbenzenesulfonate; bis(4-tert-butoxyphenyl)( 4-dimethylaminophenyl)sulfonium p-tert-butylbenzenesulfonate; (4-tert-butoxyphenyl)bis(4-dimethylaminophenyl)sulfonium benzenesulfonate; bis(4-tertbutoxycarbonylmethyloxyphenyl)(4-dimethylaminophenyl)sulfonium benzenesulfonate; (4-tert-butoxycarbonylmethyloxyphenyl)bis(4-dimethylaminophenyl)sulfonium benzenesulfonate; tris(3-dimethylaminophenyl)sulfonium p-toluenesulfonate; bis(4-tert-butoxyphenyl)(3-dimethylaminophenyl)sulfonium p-toluenesulfonate; (4-tert-butoxyphenyl)bis(3-dimethylaminophenyl)sulfonium p-toluenesulfonate; bis(4-tert-butoxycarbonylmethyloxyphenyl)(3-dimethylaminophenyl)sulfonium p-toluenesulfonate; (4-tert-butoxycarbonylmethyloxyphenyl)bis(3-dimethylamino-phenyl)sulfonium p-toluenesulfonate; bis (4-(1 ethoxyethyloxy)phenyl)(3-dimethylaminophenyl)- sulfonium p-toluenesulfonate; (4(1-ethoxyethyloxy)phenyl) bis(3-dimethylaminophenyl)-sulfonium p-toluenesulfonate; bis(4-tetrahydropyranyloxyphenyl)(3-dimethylaminophenyl)-sulfonium p-toluenesulfonate; (4-tetrahydrofuranyloxyphenyl)bis(3-dimethylaminophenyl)sulfonium p-toluenesulfonate; tris(3-dimethylaminophenyl)sulfonium p-ethylbenzenesulfonate; bis(4-tert-butoxyphenyl)(3-dimethylaminophenyl)sulfonium 2,4-dimethylbenzenesulfonate; (4-tert-butoxycarbonylmethyloxyphenyl)bis(3-dimethylaminophenyl)sulfonium n-octylbenzenesulfonate; bis(4-tertbutoxyphenyl)(3-dimethylaminophenyl)sulfonium benzenesulfonate; (4-tertbutoxyphenyl)bis(3-dimethylaminophenyl)sulfonium p-tert-butylbenzenesulfonate; bis(4-tert-butoxycarbonylmethyloxyphenyl)(3-dimethylaminophenyl)sulfonium benzenesulfonate; (4-tert-butoxycarbonylmethyloxyphenyl)bis(3-dimethylaminophenyl)sulfonium benzenesulfonate; tris(4-(2-picolyloxy)phenyl)sulfonium p-toluenesulfonate; bis(4-tert-butoxyphenyl)(4-(2-picolyloxy)phenyl)sulfonium p-toluenesulfonate; (4-tert-butoxyphenyl)bis(4-(2-picolyloxy)phenyl)sulfonium p-toluenesulfonate; bis(4-tert-butoxycarbonylmethyloxyphenyl)(4-(2-picolyloxy)phenyl)sulfonium p-toluenesulfonate; (4-tertbutoxycarbonylmethyloxyphenyl)bis(4-(2-picolyloxy)phenyl)sulfonium p-toluenesulfonate; bis(4-(1-ethoxyethyloxy)phenyl)(4-(2-picolyloxy)phenyl)-sulfonium p-toluenesulfonate; (4-(1-ethoxyethyloxy)phenyl)bis(4-(2-picolyloxy)phenyl)sulfonium p-toluenesulfonate; bis(4-tetrahydropyranyloxyphenyl)(4-(2-picolyloxy)phenyl)-sulfonium p-toluenesulfonate; (4-tetrahydrofuranyloxyphenyl)bis(4-(2-picolyloxy)phenyl)-sulfonium p-toluenesulfonate; tris(4-(2-picolyloxy)phenyl)sulfonium p-ethylbenzene-sulfonate; tris(4-(2-picolyloxy)phenyl)sulfonium 2,4-dimethylbenzene-sulfonate; bis(4-tertbutoxyphenyl)(4-(2-picolyloxy)phenyl)sulfonium 2,4-dimethylbenzenesulfonate; (4-tert-butoxyphenyl)bis(4-(2-picolyloxy)phenyl)sulfonium 2,4-dimethylbenzenesulfonate; (4-tert-butoxyphenyl)bis(4-(2-picolyloxy)phenyl)sulfonium p-tert-butylbenzenesulfonate; bis(4-tertbutoxycarbonylmethyloxyphenyl)(4-(2-picolyloxy)phenyl)sulfonium 2,5-dimethylbenzenesulfonate; (4-tert-butoxycarbonylmethyloxyphenyl)bis(4-(2-picolyloxy)phenyl)sulfonium n-octylbenzenesulfonate; tris(4-(2-picolyloxy)phenyl)sulfonium p-tert-butylbenzene-sulfonate; bis(4-tertbutoxyphenyl)(4-(2-picolyloxy)phenyl)sulfonium benzenesulfonate; (4-tertbutoxyphenyl)bis(4-(2-picolyloxy)phenyl)sulfonium benzenesulfonate; bis(4-tertbutoxycarbonylmethyloxyphenyl)(4-(2-picolyloxy)phenyl)sulfonium benzenesulfonate; (4-tert-butoxycarbonylmethyloxyphenyl)bis(4-(2-picolyloxy)phenyl)sulfonium benzenesulfonate; tris(4-(4-picolyloxy)phenyl)sulfonium p-toluenesulfonate; bis(4-tert-butoxyphenyl)(4-(4-picolyloxy)phenyl)sulfonium p-toluenesulfonate; (4-tert-butoxyphenyl)bis(4-(4-picolyloxy)phenyl)sulfonium p-toluenesulfonate; bis(4-tert-butoxycarbonylmethyloxyphenyl)(4-(4-picolyloxy)phenyl)sulfonium p-toluenesulfonate; (4-tert-butoxycarbonylmethyloxyphenyl)bis(4(4-picolyloxy)phenyl)sulfonium p-toluenesulfonate; bis(4-(1 ethoxyethyloxy)phenyl)(4-(4-picolyloxy)phenyl)-sulfonium p-toluenesulfonate; (4-(1-ethoxyethyloxy)phenyl)bis(4-(4-picolyloxy)phenyl)-sulfonium p-toluenesulfonate; bis(4-tetrahydropyranyloxyphenyl)(4-(4-picolyloxy)phenyl)-sulfonium p-toluenesulfonate; (4-tetrahydrofuranyloxyphenyl)bis(4-(4-picolyloxy)phenyl) sulfonium p-toluenesulfonate; tris(4-(4-picolyloxy)phenyl) sulfonium p-ethylbenzenesulfonate; tris(4-(4-picolyloxy) phenyl)sulfonium 2,4-dimethylbenzene-sulfonate; bis(4-tert-butoxyphenyl)(4-(4-picolyloxy)phenyl)sulfonium 2,4-dimethylbenzenesulfonate; (4-tert-butoxyphenyl)bis(4-(4-picolyloxy)phenyl)sulfonium 2,4-dimethylbenzenesulfonate; (4-tert-butoxycarbonylmethyloxyphenyl)bis( 4-(4-picolyloxy)-phenyl)sulfonium 2,4-dimethylbenzenesulfonate; bis(4-tert-butoxyphenyl)(4-(4-picolyloxy)phenyl)sulfonium p-tert-butylbenzenesulfonate; (4-tertbutoxyphenyl)bis(4-(4-picolyloxy)phenyl)sulfonium p-tert-butylbenzenesulfonate; bis(4-tert-butoxycarbonylmethyloxyphenyl)(4-(4-picolyloxy)-phenyl)sulfonium 2,5-dimethylbenzenesulfonate; (4-tert-butoxycarbonylmethyloxyphenyl)bis(4-(4-picolyloxy)phenyl)sulfonium n-octylbenzenesulfonate; tris(4-(4-picolyloxy)phenyl)sulfonium p-tert-butylbenzene-sulfonate; bis(4-tertbutoxyphenyl)(4-(4-picolyloxy)phenyl) sulfonium benzenesulfonate; (4-tertbutoxyphenyl)(4-(4-picolyloxy)phenyl)sulfonium p-tert-butylbenzenesulfonate; bis(4-tert-butoxycarbonylmethyloxyphenyl)(4-(4-picolyloxy)-phenyl)sulfonium benzenesulfonate; (4-tert-butoxycarbonylmethyloxyphenyl)bis(4-(4-picolyloxy) phenyl)sulfonium benzenesulfonate; tris(3-(4-picolyloxy) phenyl)sulfonium p-toluenesulfonate; bis(4-tert-butoxyphenyl)(3-(4-picolyloxy)phenyl)sulfonium p-toluenesulfonate; (4-tert-butoxyphenyl)bis(3-(4-picolyloxy)phenyl)sulfonium p-toluenesulfonate; bis(4-tert-butoxycarbonylmethyloxyphenyl)(3-(4-picolyloxy)phenyl) sulfonium p-toluenesulfonate; (4-tert-butoxycarbonylmethyloxyphenyl)bis(3(4-picolyloxy)-phenyl)sulfonium p-toluenesulfonate; bis(4-(1-ethoxyethyloxy)phenyl)(3-(4-picolyloxy)phenyl)-sulfonium p-toluenesulfonate; (4-(1-ethoxyethyloxy)phenyl)bis(3-(4-picolyloxy)phenyl)-sulfonium p-toluenesulfonate; bis(4-tetrahydropyranyloxyphenyl)(3-(4-picolyloxy)phenyl)-sulfonium p-toluenesulfonate; (4-tetrahydrofuranyloxyphenyl)bis(3-(4-picolyloxy)phenyl) sulfonium p-toluenesulfonate; tris(3-(4-picolyloxy)phenyl) sulfonium p-ethylbenzenesulfonate; tris(3-(4-picolyloxy) phenyl)sulfonium 2,4-dimethylbenzene-sulfonate; bis(4-tert-butoxyphenyl)(3-(4-picolyloxy)phenyl)sulfonium 2,4-dimethylbenzenesulfonate; (4-tert-butoxyphenyl)bis(3-(4-picolyloxy)phenyl)sulfonium 2,4-dimethylbenzenesulfonate; bis(4-tertbutoxycarbonylmethyloxyphenyl)(3-(4-picolyloxy)-phenyl)sulfonium 2,4-dimethylbenzenesulfonate; (4-tert-butoxycarbonylmethyloxyphenyl)bis(3-(4-picolyloxy)-phenyl)sulfonium 2,4-dimethylbenzenesulfonate; (4-tertbutoxycarbonylmethyloxyphenyl)bis(3-(4-picolyloxy)-phenyl)sulfonium n-octylbenzenesulfonate; tris(3-(4-picolyloxy)phenyl)sulfonium benzenesulfonate; bis(4-tert-butoxyphenyl)(3-(4-picolyloxy)phenyl)sulfonium benzenesulfonate; (4-tertbutoxycarbonylmethyloxyphenyl) bis(3-(4-picolyloxy)phenyl)sulfonium benzenesulfonate; tris(3-(2-picolyloxy)phenyl)sulfonium p-toluenesulfonate; bis(4-tert-butoxyphenyl)(3-(2-picolyloxy)phenyl) sulfonium p-toluenesulfonate; (4-tertbutoxyphenyl)bis(3-(2-picolyloxy)phenyl)sulfonium p-toluenesulfonate; bis(4-tertbutoxycarbonylmethyloxyphenyl)(3-(2-picolyloxy)-phenyl)sulfonium p-toluenesulfonate; (4-tert-butoxycarbonylmethyloxyphenyl)bis(3-(2-picolyloxy) phenyl)sulfonium p-toluenesulfonate; bis(4-(1-ethoxyethyloxy)phenyl)(3-(2-picolyloxy)phenyl)-sulfonium p-toluenesulfonate; (4-(1-ethoxyethyloxy)phenyl)bis(3(2- picolyloxy)phenyl)sulfonium p-toluenesulfonate; bis(4-tetrahydropyranyloxyphenyl)(3-(2-picolyloxy)phenyl)-sulfonium p-toluenesulfonate; (4-tetrahydrofuranyloxyphenyl)bis(3-(2-picolyloxy) phenyl)-sulfonium p-toluenesulfonate; tris(3-(2-picolyloxy) phenyl)sulfonium p-ethylbenzene-sulfonate; tris(3-(2-picolyloxy)phenyl)sulfonium 2,4-dimethylbenzene-sulfonate; bis(4-tertbutoxyphenyl)(3-(2-picolyloxy)phenyl) sulfonium 2,4-dimethylbenzenesulfonate; (4-tert-butoxycarbonylmethyloxyphenyl)bis(3-(2-picolyloxy)-phenyl)sulfonium 2,4-dimethylbenzenesulfonate; (3-tert-butoxyphenyl)bis(3-(2-picolyloxy)phenyl)sulfonium p-tert-butylbenzenesulfonate; bis(4-tertbutoxycarbonylmethyloxyphenyl)(3-(2-picolyloxy)-phenyl)sulfonium 4-tertbutylbenzenesulfonate; (4-tert-butoxycarbonylmethyloxyphenyl)bis(3-(2-picolyloxy) phenyl)sulfonium n-octylbenzenesulfonate; tris(3-(2-picolyloxy)phenyl)sulfonium benzenesulfonate; bis(4-tert-butoxyphenyl)(3-(2-picolyloxy)phenyl)sulfonium benzenesulfonate; (4-tert-butoxycarbonylmethyloxyphenyl) bis(3-(2-picolyloxy)phenyl)sulfonium benzenesulfonate; tris(pyridin-3-yl)sulfonium p-toluenesulfonate; bis(4-tert-butoxyphenyl)(pyridin-3-yl)sulfonium p-toluenesulfonate; (4-tertbutoxyphenyl)bis(pyridin-3-yl)sulfonium p-toluenesulfonate; bis(4-tertbutoxycarbonylmethyloxyphenyl)(pyridin-3-yl)-sulfonium p-toluenesulfonate; (4-tertbutoxycarbonylmethyloxyphenyl)bis(pyridin-3-yl)-sulfonium p-toluenesulfonate; bis(4-(1-ethoxyethyloxy) phenyl)(pyridin-3-yl)sulfonium p-toluenesulfonate; (4-(1-ethoxyethyloxy)phenyl)bis(pyridin-3-yl)sulfonium p-toluenesulfonate; bis(4-tetrahydropyranyloxyphenyl) (pyridin-3-yl)sulfonium p-toluenesulfonate; (4-tetrahydrofuranyloxyphenyl)bis(pyridin-3-yl)sulfonium p-toluenesulfonate; tris(pyridin-3-yl)sulfonium p-ethylbenzenesulfonate; tris(pyridin-3-yl)sulfonium 2,4-dimethylbenzenesulfonate; bis(4-tert-butoxyphenyl) (pyridin-3-yl)sulfonium 2,4-dimethyl-benzenesulfonate; (4-tert-butoxycarbonylmethyloxyphenyl)bis(pyridin-3-yl) sulfonium 2,4-dimethylbenzenesulfonate; (4-tert-butoxyphenyl)bis(pyridin-3-yl)sulfonium p-tert-butylbenzenesulfonate; (4-tertbutoxycarbonylmethyloxyphenyl)bis(pyridin-3-yl)-sulfonium noctylbenzenesulfonate; tris(pyridin-3-yl) sulfonium benzenesulfonate; bis(4-tertbutoxyphenyl) (pyridin-3-yl)sulfonium benzenesulfonate; (4-tertbutoxycarbonylmethyloxyphenyl)bis(pyridin-3-yl)-sulfonium benzenesulfonate; tris(pyridin-2-yl)sulfonium p-toluenesulfonate; bis(4-tert-butoxyphenyl)(pyridin-2-yl) sulfonium p-toluenesulfonate; (4-tert-butoxyphenyl)bis (pyridin-2-yl)sulfonium p-toluenesulfonate; bis(4-tert-butoxycarbonylmethyloxyphenyl)(pyridin-2-yl)-sulfonium p-toluenesulfonate; (4-tert-butoxycarbonylmethyloxyphenyl)bis(pyridin-2-yl) sulfonium p-toluenesulfonate; bis(4-(1-ethoxyethyloxy) phenyl)(pyridin-2-yl)sulfonium p-toluenesulfonate; (4-(1-ethoxyethyloxy)phenyl)bis(pyridin-2-yl)sulfonium p-toluenesulfonate; bis(4-tetrahydropyranyloxyphenyl) (pyridin-2-yl)sulfonium p-toluenesulfonate; (4-tetrahydrofuranyloxyphenyl)bis(pyridin-2-yl)sulfonium p-toluenesulfonate; tris(pyridin-2-yl)sulfonium p-ethylbenzenesulfonate; tris(pyridin-2-yl)sulfonium 2,4-dimethylbenzenesulfonate; bis(4-tertbutoxyphenyl) (pyridin-2-yl)sulfonium 2,4-dimethylbenzenesulfonate; (4-tertbutoxyphenyl)bis(pyridin-2-yl)sulfonium 2,4-dimethylbenzenesulfonate; bis(3-tertbutoxycarbonylmethyloxyphenyl)(pyridin-2-yl)-sulfonium 2,4-dimethylbenzenesulfonate; (4-tert-butoxycarbonylmethyloxyphenyl)bis(pyridin-2-yl) sulfonium 2,4-dimethylbenzenesulfonate; (4-tert-butoxyphenyl)bis(pyridin-2-yl)sulfonium p-tert-butylbenzenesulfonate; (4-tertbutoxycarbonylmethyloxyphenyl)bis(pyridin-2-yl)-sulfonium noctylbenzenesulfonate; and tris(pyridin-2-yl) sulfonium benzenesulfonate.

In still yet another embodiment, the photoacid generator includes alkylsulfonium salts. Examples of alkylsulfonium salts include cyclohexylmethyl(2-oxocyclohexyl) sulfonium trifluoromethanesulfonate; dicyclohexyl(2-oxocyclohexyl)sulfonium trifluoromethanesulfonate; cyclopentylmethyl(2-oxocyclohexyl)sulfonium trifluoromethanesulfonate; and cycloheptylmethyl(2-oxocyclopentyl)sulfonium trifluoromethanesulfonate.

Resists may include a 157 nm sensitive resist, a 193 nm sensitive resist, an I-line (365 nm sensitive resist), H-line, G-line, E-line, mid UV, deep UV (248 nm sensitive resist), an extreme UV resist material (13 nm and 11 nm sensitive resists), an X-ray sensitive resist, and an e-beam sensitive resist. Deep UV resists are preferred. Resists are commercially available from a number of sources, including Shipley Company, Kodak, Hoechst Celanese Corporation, Arch Chemical, Aquamer, Hunt, Clariant, JSR Microelectronics, and Brewer. A specific example of a deep UV photoresist is a combination of a partially t-butoxycarbonyloxy substituted poly-phydroxystyrene and a photoacid generator.

The resist may be deposited using any suitable means on the substrate. For example, the resist may be spin-coated on the substrate. The resist is applied to any suitable thickness as the initial thickness is not critical to the invention. In one embodiment, the resist is applied to a thickness from about 200 Å to about 30,000 Å. In another embodiment, the resist is applied to a thickness from about 1,000 Å to about 20,000 Å.

A coating containing a cleaving compound is deposited over the resist. The coating contains at least one cleaving compound and a coating material. The coating material is typically a polymeric material suitable for forming removable coatings. A removable coating can be adsorbed, dissolved, and/or solubilized by a removing solution. Coating materials include water soluble polymers, base soluble polymers, acid soluble polymers, and organic soluble polymers. Thus, removing solutions include suitable aqueous solutions, base solutions, acid solutions, and organic solvents.

The cleaving compound is mobile within the coating in that it can migrate to the interface between the coating and the resist and diffuse into the resist. Cleaving compounds include organic and inorganic acids, as well as acid producing compounds. Such cleaving compounds cleave acid labile groups that are attached to the resist polymer backbone.

In one embodiment, an acid containing coating is deposited over the resist. In this embodiment, the coating contains at least one acid cleaving compound and a coating material. Acids include inorganic acids, organic acids and photoacid generators. Specific examples of inorganic acids include nitric acid, halogen acids such as hydrofluoric acid, hydrochloric acid, hydrobromic acid and hydriotic acid, sulfuric acid, sulfurous acid, perchloric acid, boric acid and phosphorus acids such as phosphorus acid and phosphoric acid.

Organic acids include carboxylic acids and polycarboxylic acids such as alkanoic acids, including formic acid, acetic acid, propionic acid, butyric acid and so on, dichloroacetic acid, trichloroacetic acid, perfluoroacetic acid, perfluorooctanoic acid, (generally containing 1 to about 10 carbon atoms), dicarboxylic acids, such as oxalic acid, malonic acid, succinic acid and so on (generally containing I to about 12 carbon atoms), hydroxyalkanoic acids, such as citric acid (generally containing 1 to about 10 carbon atoms), organic phosphorus acids such as dimethylphosphoric acid and dimethylphosphinic acid, sulfonic acids such as alkylsulfonic acids (containing 1 to about 20 carbon atoms) including methanesulfonic acid, ethanesulfonic acid, 1 pentanesulfonic acid, 1-hexanesulfonic acid, 1-heptanesulfonic acid, aromatic sulfonic acids such as benzenesulfonic acid, benzenedisulfonic acid, tolulenesulfonic acid, naphthalenesulfonic acid, etc.

As stated above, photoacid generators produce acids due to light or heat activation. The photoacid generators mentioned above in connection with the resist materials may also be employed in the acid containing coating. They are not listed again here for the sake of brevity. Nevertheless, preferred photoacid generators for the acid containing coating include oniumtriflates such as triphenylsulfonium trifluoromethylsulfonate; triazine derivatives, carboximide sulfonates; methane sulfonoxybenzene; and nitrobenzyl esters such as 4-nitrobenzenesulfonic acid-2-6-dinitrobenzyl ester; 4-methoxybenzenesulfonic acid-2-6-dinitrobenzyl ester; toluenesulfonic acid-2-6-dinitrobenzyl ester; trifluoracetic acid-2-6-dinitrobenzyl ester; 2,3,4,5,6-pentafluorobenzenesulfonic acid-2-6-dinitrobenzyl ester; phenylsulfonic acid-2-6-dinitrobenzyl ester; methylsulfonic acid-2-6-dinitrobenzyl ester; perfluorooctanoic acid-2-6-dinitrobenzyl ester; and trifluormethylsulfonic acid2-6-dinitrobenzyl ester. Moreover, in some embodiments, two or more of any of the above-described acids may be used.

Water soluble polymers according to the invention are those which can form films. Water soluble polymers include poly(acrylic acid), poly(methacrylic acid), poly(vinyl alcohol), poly(vinyl acetal), mixtures of poly(vinyl acetal) and methoxymethylol-urea, mixtures of poly(vinyl acetal) and methoxy-methylol-melamine, mixtures of poly(vinyl acetal), methoxy-methylol-melamine and polyallyl-amine, cellulose derivatives including hydroxypropyl cellulose, hydroxyethyl cellulose, hydroxyalkyl alkali metal carboxylalkyl cellulose derivatives, and free acid hydroxyalkyl carboxyalkyl cellulose derivatives, natural polysaccharide gums and their derivatives, polyethylene glycol, water soluble polyesters, polyvinyl pyrrolidone, polycarboxylic acid derivatives, vinyl methyl ether homopolymers and copolymers, casein, gelatin, solubilized proteins, polyacrylamide, polyamines, polyquaternary amines, styrene maleic anhydride (SMA) resins, and polyethylene amine. Water soluble polymers further include carbohydrates such as starch derived from different plant sources, including high amylose and high amylopectin varieties. By "starch," as referred to herein, is also meant water soluble film forming polymeric materials derived from starch including starch derivatives such as starch hydrolyzate products, modified starches, modified starch derivatives and maltodextrins.

The coating contains a suitable amount of cleaving compound (acid or photoacid generator) to form a deprotected resist layer within the resist (at the top of the resist). In one embodiment, the coating contains from about 0.001% to about 10% by weight of at least one cleaving compound. In another embodiment, the coating contains from about 0.01% to about 5% by weight of at least one cleaving compound. In yet another embodiment, the coating contains from about 0.05% to about 1% by weight of at least one cleaving compound. Generally, a higher cleaving compound concentration in the coating leads to a thicker deprotected resist layer within the resist. The coating may optionally further contain various additives such as coating forming additives, surfactants, mobility enhances, etc.

The time which the coating containing the cleaving compound is permitted to contact the resist depends primarily upon the identity of the cleaving compound, the concentration of the cleaving compound in the coating, the identity of the resist, and the desired size or thickness of the deprotected resist layer. In one embodiment, the coating containing the cleaving compound is permitted to contact the resist for a time period from about I second to about 3 hours, although slightly shorter or longer times may be permitted. In another embodiment, the coating containing the cleaving compound is permitted to contact the resist for a time period from about 10 seconds to about 30 minutes. In yet another embodiment, the coating containing the cleaving compound is permitted to contact the resist for a time period from about 15 seconds to about 5 minutes. Generally, a longer contact time leads to a thicker resulting deprotected resist layer.

Optionally, heat is applied when the coating containing the cleaving compound is contacted with the resist. In some instances, heat promotes the formation of the deprotection layer. In one embodiment, the coating containing the cleaving compound is contacted with the resist at a temperature from about 20° C. to about 200° C. In another embodiment, the coating is contacted with the resist at a temperature from about 40° C. to about 150° C. In yet another embodiment, the coating is contacted with the resist at a temperature from about 50° C. to about 110° C.

In embodiments where the coating containing the cleaving compound contains a photoacid generator, the substrate is subjected to a suitable amount of blanket radiation to induce the generation of acid by the photoacid generator in the coating. However, the dose of radiation should not deeply penetrate the resist layer. Such deep penetration may subsequently lead to poor pattern formation upon development of the thinned resist after being treated in accordance with the present invention.

The thickness of the deprotected resist layer formed within the resist is from about 10 Å to about 5,000 Å. In another embodiment, the thickness of the deprotected resist layer formed within the resist is from about 20 Å to about 3,000 Å. In yet another embodiment, the thickness of the deprotected resist layer formed within the resist is from about 25 Å to about 2,000 Å. In one embodiment, the thickness of the deprotected resist layer is substantially uniform in the portions adjacent the coating containing the cleaving compound in that the thickness does not vary by more than about 100 Å, and preferably by not more than about 10 Å, comparing the thickest and thinnest areas.

The coating containing the cleaving compound is removed from the substrate using any suitable means, such as using a removing solution. Generally, the coating containing the cleaving compound is removed from the substrate using an aqueous, basic, acidic or organic solution. It is noted that in some embodiments, the removing solution may also remove the deprotected resist layer. This is permissible so long as the resist is not deformed or degraded by the removing solution. The aqueous, basic, acidic or organic solution adsorbs, dissolves, and/or solubilizes the coating containing the cleaving compound. In an optional embodiment, the substrate is rinsed after the coating is removed. In some instances, rinsing with water serves to quench or inhibit further chemical change induced by the cleaving compound upon the resist layer. Removing solutions include water, deionized water, hydroxide solutions such as sodium hydroxide solutions, potassium hydroxide solutions, quaternary ammonium hydroxide solutions, mildly acidic solutions, and organic solvents, all of which may optionally contain at least one surfactant.

The deprotected resist layer is then removed from the resist (it is noted that the deprotected resist layer may be removed from the resist during removal of the coating containing the cleaving compound). The deprotected resist layer is removed in a manner so that the remaining portion resist is not deformed or degraded. In this connection, the un-deprotected portion of the resist acts as an etch stop layer when removing the deprotected resist layer. Dry or wet etching techniques may be employed, although wet etch techniques are preferred. In a preferred embodiment, a developer, commonly used to pattern an irradiated resist, is used to remove the deprotected resist layer from the resist. For example, hydroxide developers including sodium hydroxide solutions, potassium hydroxide solutions, quaternary (alkyl) ammonium hydroxide solutions, all of which may or may not contain at least one surfactant, may be employed.

Remaining on the substrate is a resist in which the thickness of the resist is smaller compared to immediately after deposition. In one embodiment, the thinned resist treated in accordance with the present invention has a thickness from about 150 Å to about 25,000 Å. In another embodiment, the thinned resist has a thickness from about 250 Å to about 15,000 Å. In yet another embodiment, the thinned resist has a thickness from about 500 Å to about 5,000 Å. In one embodiment, the thinned resist has a thickness that is at least about 10% smaller than the resist immediately after deposition. In another embodiment, the thinned resist has a thickness that is at least about 20% smaller than the resist immediately after deposition. In yet another embodiment, the thinned resist has a thickness that is at least about 30% smaller than the resist immediately after deposition.

The decrease in thickness depends primarily upon the specific identity and amount of the cleaving compound, the length of time the coating containing the cleaving compound is in contact with the resist, and the identity of the resist material. The thickness of the resist is decreased corresponding to the thickness of the deprotected resist layer.

The thinned resist is then patterned using suitable lithography techniques. That is, after the resist is thinned, a mask is employed to selectively irradiate the thinned resist, followed by development wherein the exposed or unexposed portions of the thinned resist are removed. Any developer may be used to remove the exposed or unexposed portions of the thinned resist including aqueous alkaline developers. Aqueous alkaline developers typically contain a hydroxide compound, such as tetramethylammonium hydroxide.

The resulting thinned resist pattern made in accordance with the present invention may be useful for subsequent processing of the substrate on which it is positioned. For example, the thinned resist pattern made in accordance with the present invention may be used for forming narrow features using one of photolithography techniques (pattern transfer to underlying layer), etching techniques, or deposition techniques. In particular, the thinned resist pattern made in accordance with the present invention may be used as a mask during photolithography techniques, etching techniques, or deposition techniques. In one embodiment, the thinned resist pattern made in accordance with the present invention consists of a plurality of lines that have improved critical dimension control than the originally patterned resist.

One specific embodiment of the methods of the present invention is now described in connection with Figures. Referring to FIG. 1, a structure 10 is provided with substrate 12 and an acid catalyzed resist 14 over a portion of the substrate 12. The resist 14 has a thickness of about 5,000 Å. Although not shown, substrate 12 may include any suitable semiconductor material (one or more layers of semiconductor materials), for example, a monocrystalline silicon substrate. Also, although not shown, substrate 12 may include of one or more layers including substrate layers, diffusion regions, dielectric layers such as oxides, devices, polysilicon layers, and the like. An acid containing coating 16 is deposited over the structure 10 covering the resist 14. The acid containing coating 16 contains a water soluble polymer and an acid.

Figure 2:
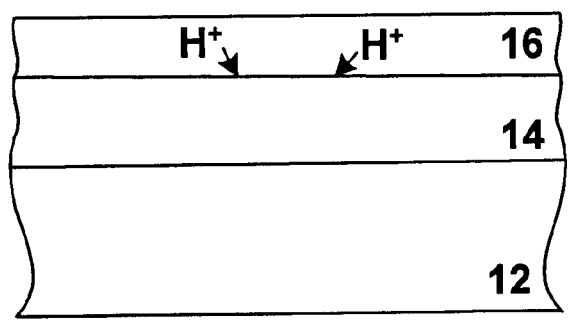
FIG. 2 illustrates a cross-sectional view of one aspect of a method according to the present invention.

Referring to FIG. 2, mobile $H^+$ ions in the acid containing coating 16 near the resist 14 diffuse into the resist 14 and begin to form a deprotected resist layer (not shown yet). Although not wishing to be bound by any theory, it is believed that protons effect chemical change by cleaving acid labile moieties of the resist polymer material.

Figure 3:
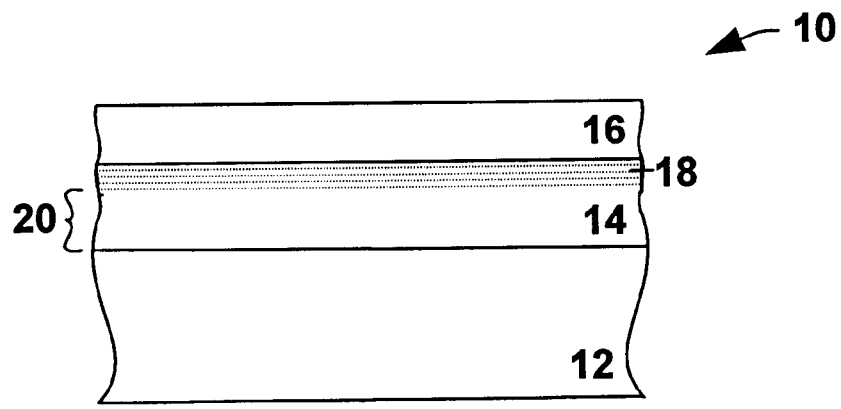
FIG. 3 illustrates a cross-sectional view of one aspect of a method according to the present invention.

Referring to FIG. 3, after a suitable period of time, a deprotected resist layer 18 forms within the original resist 14. A portion of resist 20 (un-deprotected portion) is not chemically influenced by the acid containing coating 16. In this embodiment, the thickness of the deprotected resist layer 18 is about 2,500 Å. The thickness of the deprotected resist layer 18 is substantially uniform within the top portion of resist 14.

Figure 4:
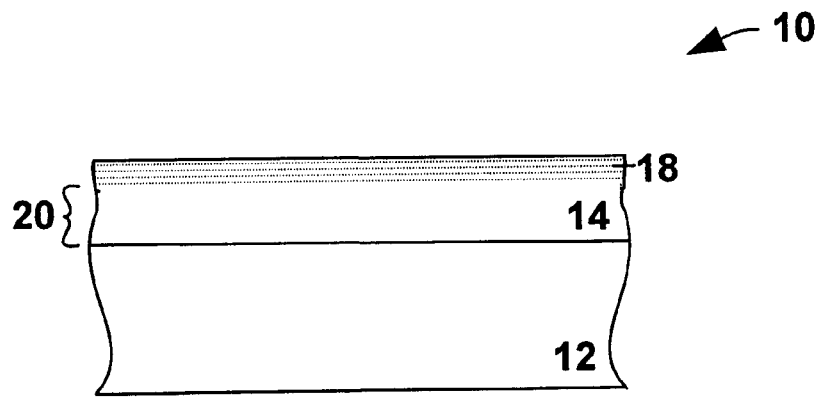
FIG. 4 illustrates a cross-sectional view of one aspect of a method according to the present invention.

Referring to FIG. 4, the acid containing coating 16 is removed by suitable means. For example, a water rinse is used to remove the acid containing coating 16 from structure 10 leaving resist 14 comprised of the deprotected resist layer 16 above the un-deprotected portion 20.

Figure 5:
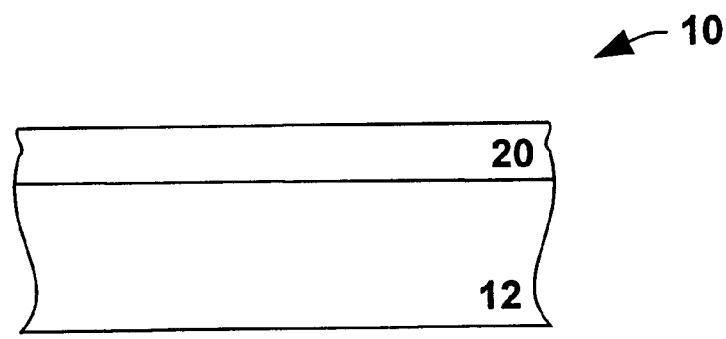
FIG. 5 illustrates a cross-sectional view of the results of one aspect of a method according to the present invention.

Referring to FIG. 5, the deprotected resist layer 18 is removed by suitable means. For example, the structure 10 is contacted with a suitable developer, such as an aqueous solution of tetramethylammonium hydroxide, to remove the deprotected resist layer 18 from substrate 10 leaving the un-deprotected portion 20 as the thinned resist. The un-deprotected portion 20 (resulting thinned resist) is not degraded or damaged by the removal. The thickness of the un-deprotected portion 20 (resulting thinned resist) is about 2,500 Å.

Figure 6:
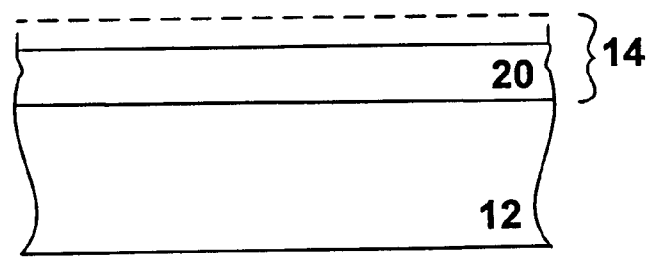
FIG. 6 illustrates a cross-sectional view of the results of one aspect of a method according to the present invention.

Referring to FIG. 6, the resulting thinned resist 20 is shown again over substrate 12, except that dashed lines are added to indicate the space assumed by the original deposited resist 14. Improved critical dimension control can be subsequently achieved by the methods of the present invention. The thinned resist 20 has fewer pinholes (a lower pinhole density) than a resist layer simply deposited at a thickness of about 2,500 Å. Since the thinned resist 20 is relatively thin, it is suitable for use with small wavelengths of radiation, which typically have difficulty in deeply penetrating resists. As a result, improved pattern formation is achievable with the present invention. Moreover, since improved resolution is associated with the use of small wavelengths of radiation, the present invention improves resolution in patterned resists.

The thinned resist 20 may be used in further semiconductor processing, such as for transferring a pattern to an underlying layer in substrate 12 (acting as etch mask pattern). The thinned resist 20 is particularly useful for forming small features using one of photolithography techniques, etching techniques, or deposition techniques.

One advantageous aspect of the chemical resist thickness reduction process of the present invention is the ability to decrease the thickness of a resist in a controllable manner by varying the amount of cleaving compound in the coating containing the cleaving compound, varying the identity of the cleaving compound in the coating containing the cleaving compound, and varying the time in which the coating is in contact with the resist.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of treating a resist layer comprising:
   providing the resist layer having a first thickness, the resist layer comprising a polymer having a labile group;
   contacting a coating containing at least one cleaving compound with the resist layer to form a deprotected resist layer at an interface between the resist layer and the coating, the deprotected resist layer having a thickness from about 10 Å to about 5,000 Å; and
   removing the coating and the deprotected resist layer leaving a resist having a second thickness, wherein the second thickness is smaller than the first thickness.

2. The method of claim 1, wherein the polymer having the labile group is a chemically amplified photoresist.

3. The method of claim 1, wherein the labile group is an acid labile group.

4. The method of claim 1, wherein the coating comprises at least one of an organic acid, an inorganic acid, and a photoacid generator.

5. The method of claim 1, wherein the coating comprises at least one of a water soluble polymer and a base soluble polymer.

6. The method of claim 1, wherein the thickness of the deprotected resist layer is from about 20 Å to about 3,000 Å.

7. The method of claim 1, wherein the coating comprises from about 0.001% to about 10% by weight of at least one cleaving compound.

8. A chemical resist thickness reduction process comprising:
   forming a resist layer having a first thickness, the resist layer comprising a polymer having an acid labile pendent group;
   depositing an acid containing coating over the resist layer, the acid containing coating comprising at least one acid and a coating material, thereby forming a deprotected resist layer at an interface between the resist layer and the acid containing coating, the deprotected resist layer having a thickness from about 10 Å to about 5,000 Å; and
   removing the acid containing coating and the deprotected resist layer thereby providing a resist layer having a second thickness, the first thickness greater than the second thickness.

9. The process of claim 8, wherein the resist layer comprises a mid ultraviolet photoresist, deep ultraviolet photoresist, a 193 nm sensitive photoresist, a 157 nm sensitive photoresist, or an extreme ultraviolet photoresist.

10. The process of claim 8, wherein the acid containing coating contains from about 0.001% to about 10% by weight of at least one of an organic acid, an inorganic acid, and a photoacid generator.

11. The process of claim 8, wherein the at least one acid comprises at least one of nitric acid, hydrofluoric acid, hydrochloric acid, hydrobromic acid, hydriotic acid, sulfuric acid, sulfurous acid, perchloric acid, boric acid, phosphorus acid, phosphoric acid, formic acid, acetic acid, propionic acid, butyric acid, dichloroacetic acid, trichloroacetic acid, perfluoroacetic acid, perfluorooctanoic acid, oxalic acid, malonic acid, succinic acid, citric acid, dimethylphosphoric acid, dimethylphosphinic acid, methanesulfonic acid, ethanesulfonic acid, 1-pentanesulfonic acid, 1-hexanesulfonic acid, 1-heptanesulfonic acid, benzenesulfonic acid, benzenedisulfonic acid, tolulenesulfonic acid, and naphthalenesulfonic acid.

12. The process of claim 8, wherein the acid containing coating comprises at least one of poly(acrylic acid), poly(methacrylic acid), poly(vinyl alcohol), cellulose derivatives, natural polysaccharide gums and their derivatives, polyethylene glycol, water soluble polyesters, polyvinyl pyrrolidone, polycarboxylic acid derivatives, vinyl methyl ether homopolymers and copolymers, casein, gelatin, solubilized proteins, polyacrylamide, polyamines, polyquaternary amines, styrene maleic anhydride resins, polyethylene amine, novolac polymers, and poly(p-hydroxystyrene).

13. The process of claim 8, wherein the acid labile pendant group comprises at least one of a t-butoxycarbonyl group, an ether group, an acetal group, and a ketal group.

14. The process of claim 8, wherein the acid containing coating covered resist layer is heated to a temperature from about 40° C. to about 200° C. for a time period from about 10 seconds to about 30 minutes prior to removing the acid containing coating and the deprotected resist layer.

15. A method of decreasing the thickness of a resist, comprising:
   providing a chemically amplified resist having a first thickness on a substrate;
   depositing an acid containing coating on the chemically amplified resist thereby forming a deprotected resist layer within the chemically amplified resist; and
   removing the acid containing coating and the deprotected resist layer leaving a chemically amplified resist having a second thickness, wherein the second thickness is at least about 10% smaller than the first thickness and the chemically amplified resist having the second thickness has a thickness from about 500 Å to about 5,000 Å.

16. The method of claim 15, wherein the chemically amplified resist comprises a photosensitive acid generator and a polymer having acid sensitive side chain groups which are bonded to the polymer backbone and are reactive towards a proton.

17. The method of claim 15, wherein the acid containing coating comprises at least one of poly(acrylic acid), poly(methacrylic acid), poly(vinyl alcohol), cellulose derivatives, natural polysaccharide gums and their derivatives, polyethylene glycol, water soluble polyesters, polyvinyl pyrrolidone, polycarboxylic acid derivatives, vinyl methyl ether homopolymers and copolymers, casein, gelatin, solubilized proteins, polyacrylamide, polyamines, polyquaternary amines, styrene maleic anhydride resins, polyethylene amine, novolac polymers, and poly(phydroxystyrene).

18. The method of claim 15, wherein the deprotected resist layer has a thickness from about 20 Å to about 3,000 Å.

19. The method of claim 15, wherein the acid containing coating covered chemically amplified resist is heated to a temperature from about 40° C. to about 150° C. for a time period from about 15 seconds to about 10 minutes prior to removing the acid containing coating and the thin deprotected resist layer.

20. The method of claim 15, wherein the deprotected resist layer is removed with an aqueous alkaline developer solution.

* * * * *